United States Patent [19]

Berkebile, Jr. et al.

[11] Patent Number: 4,621,884
[45] Date of Patent: Nov. 11, 1986

[54] ELECTRICAL SOCKET HAVING A HINGED COVER

[75] Inventors: Edward E. Berkebile, Jr., Harrisburg; Edward J. Bright, Elizabethtown, both of Pa.

[73] Assignee: AMP Incorporated, Harrisburg, Pa.

[21] Appl. No.: 831,961

[22] Filed: Feb. 24, 1986

Related U.S. Application Data

[63] Continuation of Ser. No. 683,526, Dec. 19, 1984, abandoned.

[51] Int. Cl.⁴ .............................................. H01R 9/09
[52] U.S. Cl. .......................... 339/75 MP; 339/17 CF
[58] Field of Search .......... 339/75 M, 75 MP, 17 CF

[56] References Cited

U.S. PATENT DOCUMENTS

| | | | |
|---|---|---|---|
| 3,942,854 | 3/1976 | Klein et al. | 339/17 CF |
| 4,130,327 | 12/1978 | Spaulding | 339/17 CF |
| 4,381,131 | 4/1983 | Demnianiuk | 339/17 CF |
| 4,427,249 | 1/1984 | Bright et al. | 339/75 MP |
| 4,504,105 | 3/1985 | Barkus et al. | 339/17 CF |
| 4,515,424 | 5/1985 | Sakurai | 339/17 CF |
| 4,515,425 | 5/1985 | Nakano | 339/17 CF |

Primary Examiner—John McQuade
Attorney, Agent, or Firm—Allan B. Osborne

[57] ABSTRACT

A hinged cover for use with a socket in which an electronic package may be positioned. The cover is pivotally mounted on a hinge pin extending across the socket adjacent a rear wall. Latch means are provided on the front of the cover to removably latch the cover in cooperation with downwardly facing shoulders on the front wall of the socket.

4 Claims, 4 Drawing Figures

ELECTRICAL SOCKET HAVING A HINGED COVER

This application is a continuation of application Ser. No. 683,526 filed Dec. 19, 1984, now abandoned.

U.S. Pat. No. 4,427,249 discloses a cover for an active device substrate (ADS) or leadless chip carrier (LCC) connector such as the low-height connector sold by AMP Incorporated of Harrisburg, Pa. This cover includes a frame which fits down on the substrate or carrier positioned in the connector, and arms extending from the frame to the side walls of the connector housing. A latch, attached to each arm, includes a depending member with an inwardly projecting lip which catches beneath a downwardly facing shoulder on the side walls. Laterally projecting tabs, one on the depending member near the lip and another on the latch near the arm, provide a catch and fulcrum for a tool whereby the lip can be pried out from beneath the shoulders to release the cover.

U.S. Pat. No. 4,504,105 discloses a release member for use with the cover disclosed in the above-noted patent. The release member includes a depressible plate positioned on top of the cover with depending flaps on arms extending outwardly from the plate. The flaps have notches which receive the laterally projecting tabs on the depending members on the cover. Upon depressing the plate, the flaps pivot up and out, drawing the lips out from beneath the shoulders to release the cover.

In both of the aforementioned patents, the covers are shown as being completely releasable from the connector. This feature is not objectionable in user situations; i.e., the LCC is placed in the connector, secured by the cover and substantially remains there for its life. For burn-in test sockets however, a cover having the latching features noted above and which is hinged to the socket would provide a savings in time and prevent misplaced covers.

Accordingly, it is the object of the present invention to provide a hinged cover for a socket of the type having an upwardly opened compartment in which a chip carrier is positioned.

The hinged cover is, according to the present invention, characterized by a pair of latch bearing arms extending outwardly from a front member of a frame which covers the carrier positioned in the socket, latch means on the arms which include depending members with inwardly turned lips on a free end to be latched beneath downwardly facing shoulders on the socket front wall, means to release the lips from beneath the shoulders, a U-shaped hinge pin attached to the socket and extending across and slightly above the surface adjacent the rear wall thereof, and a hinge arm extending outwardly from a rear member of the frame for mounting onto the hinge pin for pivotal movement of the cover between an open and closed position on the socket.

The hinge cover of the present invention will now be described in conjunction with the following drawings, in which.

Figure 1:
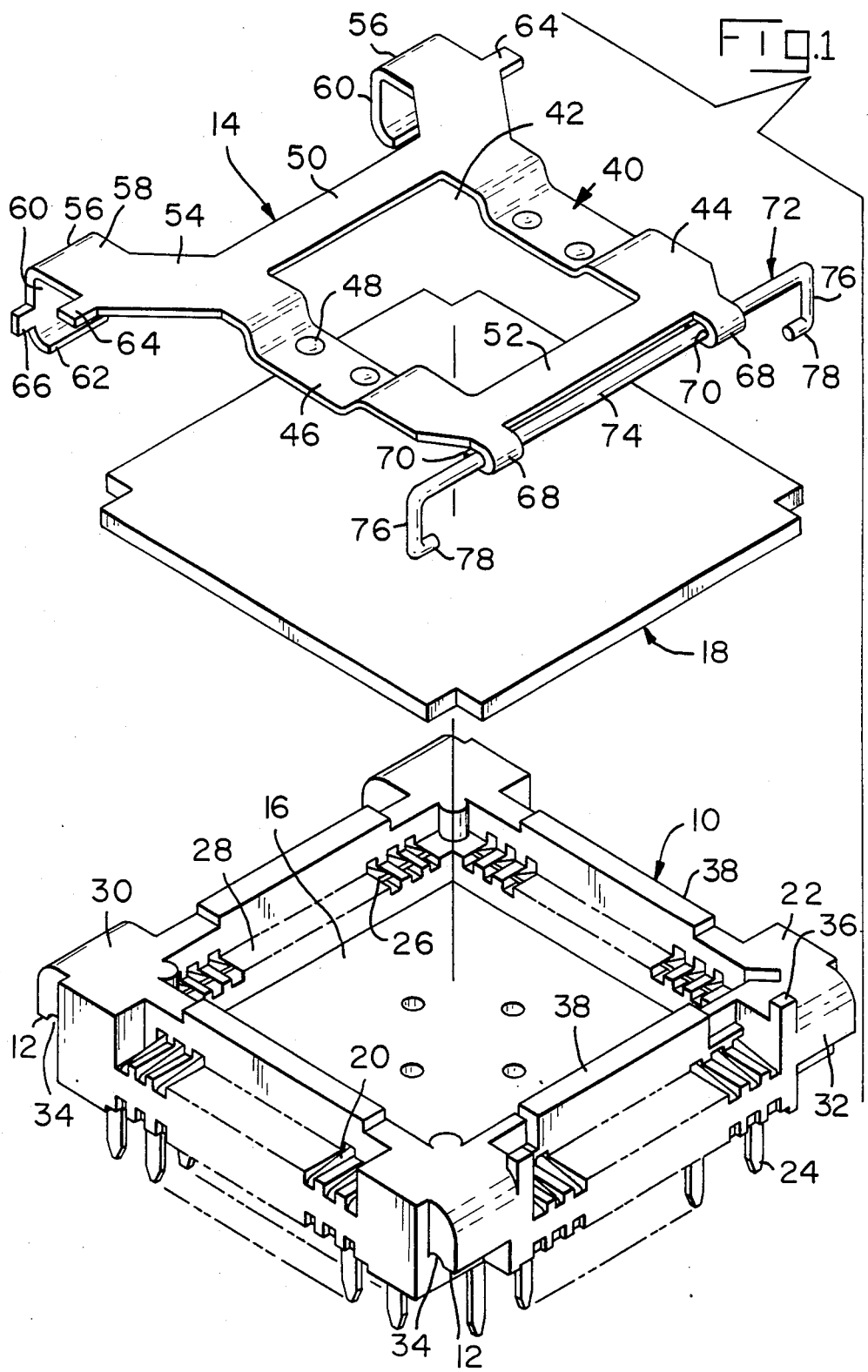
FIG. 1 is an isometric, exploded view of a socket and the hinged cover of the present invention.

Socket 10 of FIGS. 1 to 4 is known as a low-height chip carrier socket manufactured and sold by AMP Incorporated of Harrisburg, Pa. However, any similar type socket or connector having or susceptible to being modified to have downwardly facing shoulders 12 would be suitable to use cover 14 of the present invention.

The more salient features of socket 10 include upwardly open compartment 16 into which an LCC 18 is received. Contact elements 20 which are positioned in the housing 22 include depending leads 24 for insertion into holes in a printed circuit board (not shown) and, on the upper end, cantilever beams 26 which protrude out on ledge 28 extending around the walls defining the compartment. Conductive pads (not shown) on the underside of LCC 18 rest on contact surfaces (not shown) on the cantilever beams. Cover 14, when closed down on the LCC in the compartment, provides high normal forces so that a sufficient electrical contact is established and maintained between the contact surfaces and conductive pads.

Two downwardly facing shoulders 12 are provided on each of the front and rear walls of the housing, indicated by reference numerals 30 and 32 respectively. The shoulders are located at or very close to the corners of the housing. Preferably, each shoulder has a groove 34 in its surface. However, such grooves need be on only two adjacent shoulders, e.g., the shoulders on rear wall 32, and as a bare necessity such grooves may be omitted completely. However, some means should be provided on the housing to receive and retain the hinge pin 72 on cover 14.

Posts 36, located on rear wall 32 and bars 38, positioned on each side of compartment 16, are noted here for future reference.

Cover 14 includes four members, joined together at the ends thereof so as to define a frame 40 with a central opening 42 therethrough. Two parallel, spaced-apart side members 44 include a downwardly displaced center section 46 in which depending bosses 48 are provided. With the cover closed, the bosses bear against LCC 18. The bosses are preferable but are not absolutely necessary.

The other two members comprising the frame are front member 50 and rear member 52. Spaced-apart arms 54 extend obliquely laterally and forwardly from the edge of front member 50. Latch means 56, attached to the ends of each arm, include a horizontal section 58 and a depending section 60. Lip 62, turned in to project rearwardly, is provided at the free end of each depending section.

Two laterally projecting tabs are located on the outer edge of each latch means. The first tab 64 is located at the juncture between the arm 54 and the latch means. The second tab, indicated by reference numeral 66, is located down on the depending section, close to lip 62.

A pair of U-shaped hinge hooks 68 extend rearwardly from the edge of rear member 52. These hooks are located at each end of that member. The U-shaped hooks provide openings 70 therethrough.

Hinge pin 72 is shown as being attached to and, accordingly, a component of cover 14. This is preferable, although it could be part of socket 10. The pin is in the form of a broad "U", having an elongated bight or cross rod 74 with legs 76 at each end. Inwardly projecting fingers 78 are provided at the free end of each leg. The hinge pin is attached to the cover by cross rod 74 being rotatably received in openings 70 in the hinge hooks 68.

Figure 2:
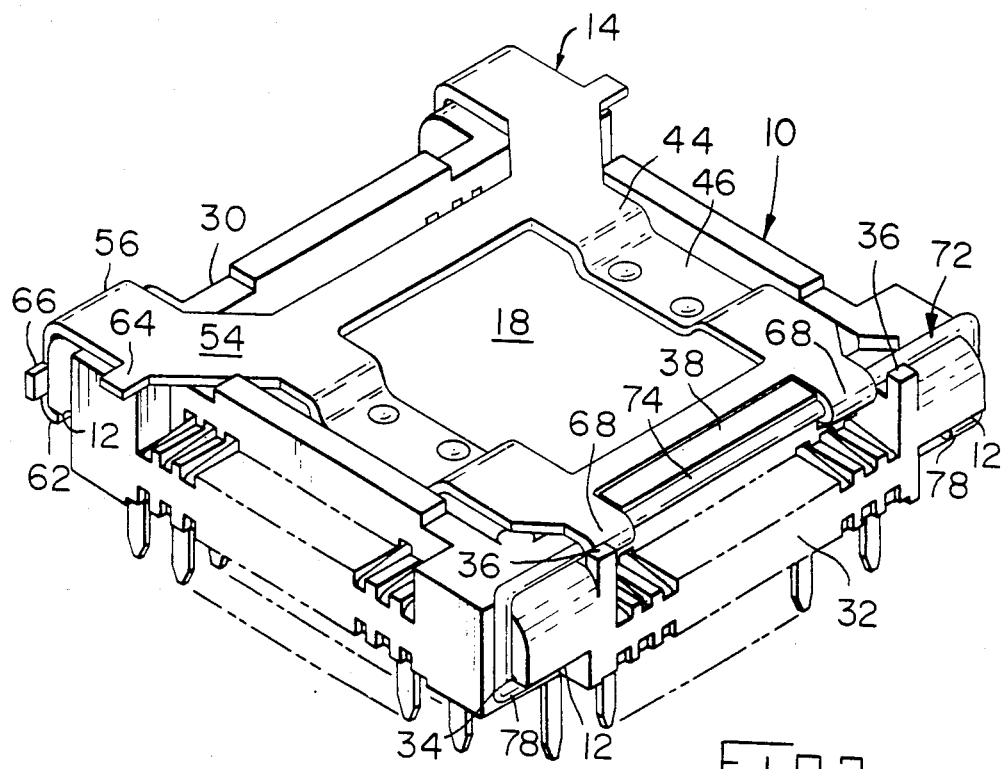
FIG. 2 is an isometric view of the socket and cover of FIG. 1 after being assembled and with the cover in a closed position.

FIG. 2 shows LCC 18 positioned in compartment 16 of socket 10 and cover 14 hinged, closed and latched to the socket. The cover is hinged to the socket by hooking fingers 78 on hinge pin 72 in grooves 34 on shoulders 12 located on rear wall 32. The cross rod 74 extends across the socket, through the hinge hook openings and, further, is bracketed on one side by posts 36 and by the bar 38 nearest rear wall 32. The hinge hooks lie to each side of that bar and in between the posts.

In the closed position, center sections 46 on side members 44 bear against LCC 18. Arms 54 extend out to the front wall with depending section 60 extending downwardly and with lips 62 in under shoulders 12 on that wall. It should be noted that the cover is of a resilient steel so that as the lip encounters the top of the wall (which is curved), it (and section 60) can flex outwardly to slide down the wall and snap in under the shoulder to latch the cover.

The cover moves to a closed or open position (not shown) by rotating on hinge pin 72. The cover is unlatched by pulling lips 62 out from under shoulders 12. The release mechanism may be a screwdriver tip placed under tab 66 and, using tab 64 as a fulcrum point, prying the lip out from beneath the shoulder.

Figure 3:
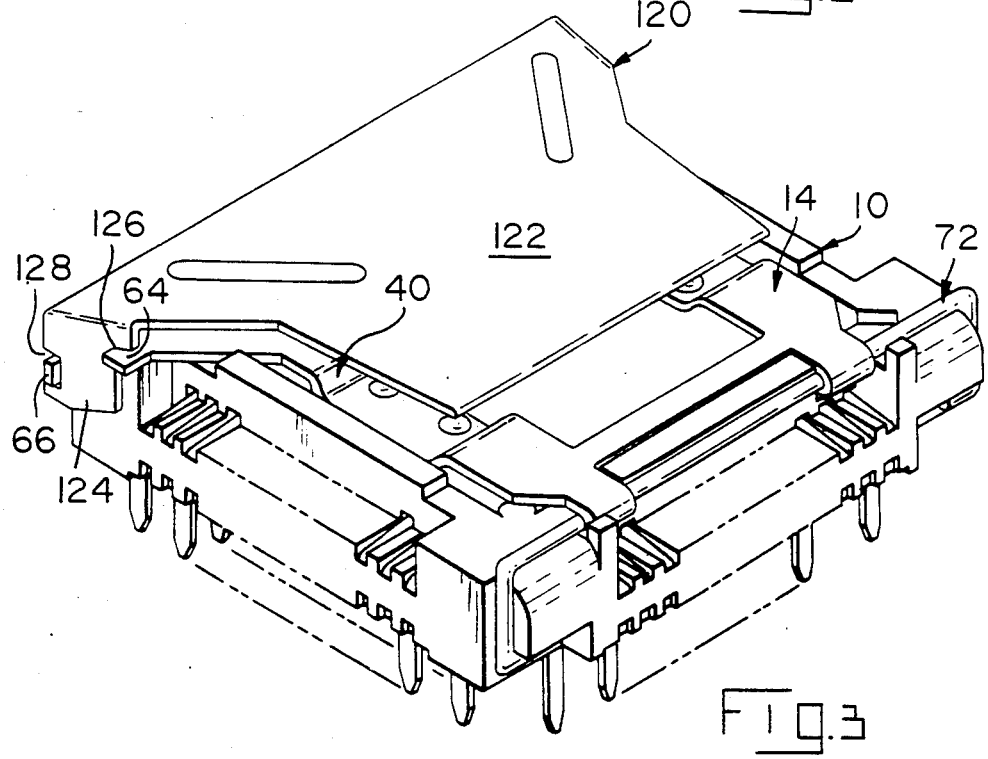
FIG. 3 is an isometric view of the socket of FIG. 1 and another embodiment of the hinged cover of the present invention.

FIG. 3 shows cover 14 with a cover release mechanism 120 incorporated therewith. This mechanism includes plate 122 and depending flaps 124 located at each side of the front member of frame 40. There are two notches in each flap: notch 126 on the rear edge and notch 128 on the front edge. Tab 64 is received in the former notch and tab 66 is received in the latter notch. The cover is unlatched by pressing down on plate 122. Using tabs 64 as fulcrums, the flaps rotate out or forwardly and up, pulling lips 62 out from under shoulders 12.

Figure 4:
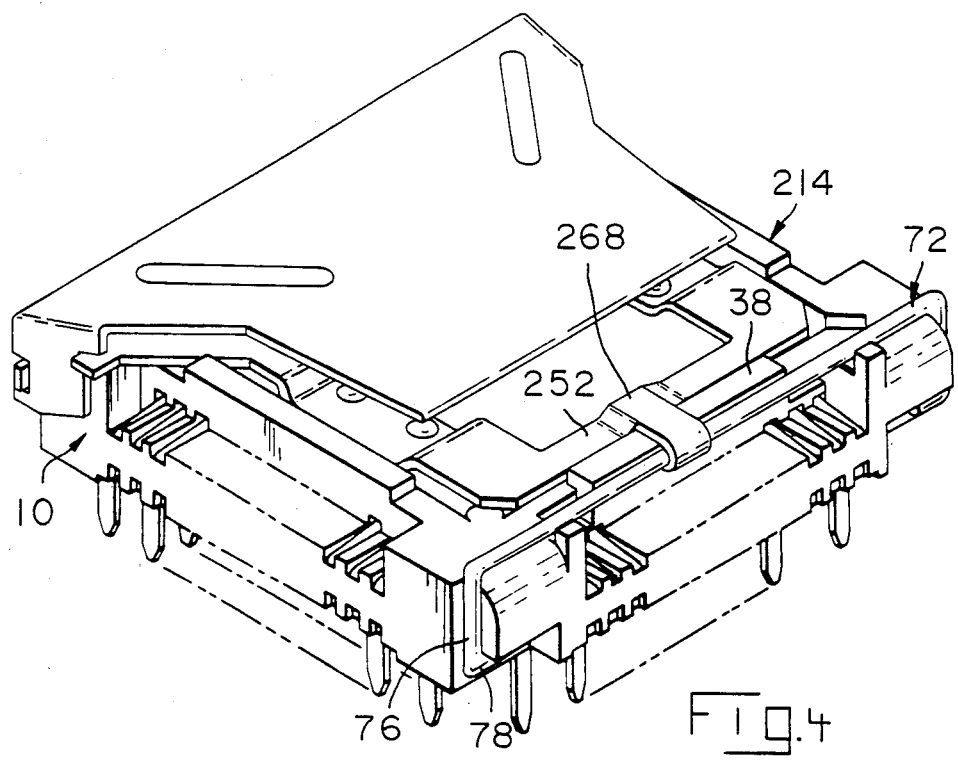
FIG. 4 is an isometric view of the socket of FIG. 1 and yet another embodiment of the hinged cover of the present invention.

FIG. 4 shows a cover 214 with a single hinge arm 268. This arm is located on rear member 252 on the frame. This modification required a method to circumvent bar 38. In this case, the arm was built up on the rear member. An alternative would have been to cut a channel through bar 38. Since the cover had to be modified in any event, placing the arm on a built-up portion on the rear member has the advantage of leaving socket 10 unmodified.

The location of grooves 34 on all four shoulders would enable a user to place the hinge fingers in the grooves on the shoulders on the front wall of the socket so that the cover could be opened in the direction opposite from that shown in the drawings. Since posts 36 are not absolutely necessary, their absence from front wall 30 would not prevent this reversing. Of course, socket 10 could be modified to include the posts on both walls 30 and 32.

The dimensions of the hinge pin 72 (and attached cover) is preferably such that the pin is tightly secured to the socket by snapping fingers 78 into grooves 34 and with cross rod 74 bracketed by posts 36 and bar 38.

The socket used in describing the hinged cover of the present invention is of the type receiving a leadless chip carrier. Workers in the connector art can readily appreciate the fact that the present invention can be used with connectors or sockets receiving different type electronic packages.

The cover has been described as including a frame 40 having front and rear members. Here again, it can be appreciated that the frame could be solid, i.e., not having a central opening, and arms 54 and hooks 68 would be attached to the front and rear edges thereof.

We claim:

1. An electrical socket for receiving an electronic package, comprising:
   housing means having receiving means for removably receiving an electronic package and conductive means for electrically engaging an electronic package positioned in said receiving means;
   downwardly facing shoulders at each end of two opposing side walls of said housing means; and
   cover means for removably retaining an electronic package in said receiving means, said cover means comprising a front member having first latch means for being removably received in under said downwardly facing shoulders on one side wall of said housing means, a rear member having hook means and a hinge pin pivotally attached to said hook means and having second latch means for being received in under said downwardly facing shoulders on the opposing side wall of said housing means whereupon said cover means may be pivotally moved between an opened and a closed position on said socket.

2. The electrical socket according to claim 1 wherein said hinge pin includes a cross rod extending across the socket adjacent said opposing side wall of said housing means and said second latch means include depending legs at each end of said cross rod and inwardly projecting fingers on said legs for being received in under said downwardly facing shoulders on said opposing side wall.

3. The electrical socket according to claim 2 further including retaining means on said opposing side wall of said housing means for retaining said hinge pin on said housing means.

4. The electrical socket according to claim 1 wherein said first latch means includes arms extending outwardly from each corner of the front member, a latch attached to each arm and having a depending member with an inwardly projecting lip at the free end thereof for being removably received in under said downwardly facing shoulders, and outwardly projecting tabs on each arm and on each depending member, said tabs on the depending member providing a catch for a pry-type tool tip and the tabs on the arms providing a fulcrum point so that upon pivoting the tool, the inwardly projecting lip may be withdrawn from the shoulder.

* * * * *